Oct. 16, 1951 C. E. MILLER 2,571,598

RADIO RECEIVER SEQUENCE TUNER

Filed May 13, 1946 3 Sheets-Sheet 1

INVENTOR
C. EUGENE MILLER
BY H. S. Grover
ATTORNEY

RADIO RECEIVER SEQUENCE TUNER

Filed May 13, 1946

INVENTOR
C. EUGENE MILLER
BY H. S. Grover
ATTORNEY

Oct. 16, 1951 C. E. MILLER 2,571,598

RADIO RECEIVER SEQUENCE TUNER

Filed May 13, 1946 3 Sheets-Sheet 3

INVENTOR
C. EUGENE MILLER
BY H. S. Grover
ATTORNEY

Patented Oct. 16, 1951

2,571,598

UNITED STATES PATENT OFFICE 2,571,598

RADIO RECEIVER SEQUENCE TUNER

Charles Eugene Miller, Indianapolis, Ind., assignor to Radio Corporation of America, a corporation of Delaware Application May 13, 1946, Serial No. 669,235

26 Claims. (Cl. 74—10.15)

The present invention relates generally to automatic tuning mechanism for radio receivers, and more particularly to an automatic tuner of the sequence type in which a series of predetermined broadcasting stations to which the tuner is adjustably set in advance are successively and automatically tuned-in by actuation of a manual control member.

One of the objects of the invention is to provide a relatively simple, compact and inexpensive tuner of the type mentioned which, although not limited thereto, is especially adaptable for use in automobile receivers because of its compactness and simplicity.

A further object of the invention is to provide a rotatable turret of novel design which serves as the position-determining mechanism for the receiver tuning elements, and novel means for effecting a step-by-step rotation of the turret during each cycle of operation of the tuner.

A still further object of the invention is to provide a turret tuner in which radially adjustable stops, operable individually in conjunction with a cam member movable with a tuning-element carrier, constitute the actuating means for adjusting the tuning element to predetermined positions of adjustment.

A more specific object of the invention is to provide in combination, an adjustable tuning element, a movable carrier for said tuning element, a cam member movable with the carrier having a cam edge, a rotatable turret provided with a plurality of equi-angularly spaced stops, said stops being individually adjustable in radial directions each to a position which determines the particular setting to which the tuning element is actuable, and means including a manually reciprocable member operable upon actuation to rotate the turret step-by-step to successive positions, rotation of the turret to a new position causing the corresponding stop to coact with the cam edge to actuate the tuning element to the setting corresponding to said stop.

These and other objects of the invention and the various features and details of the construction and operation thereof are hereinafter fully set forth and described and shown in the accompanying drawings, in which.

Figure 1:
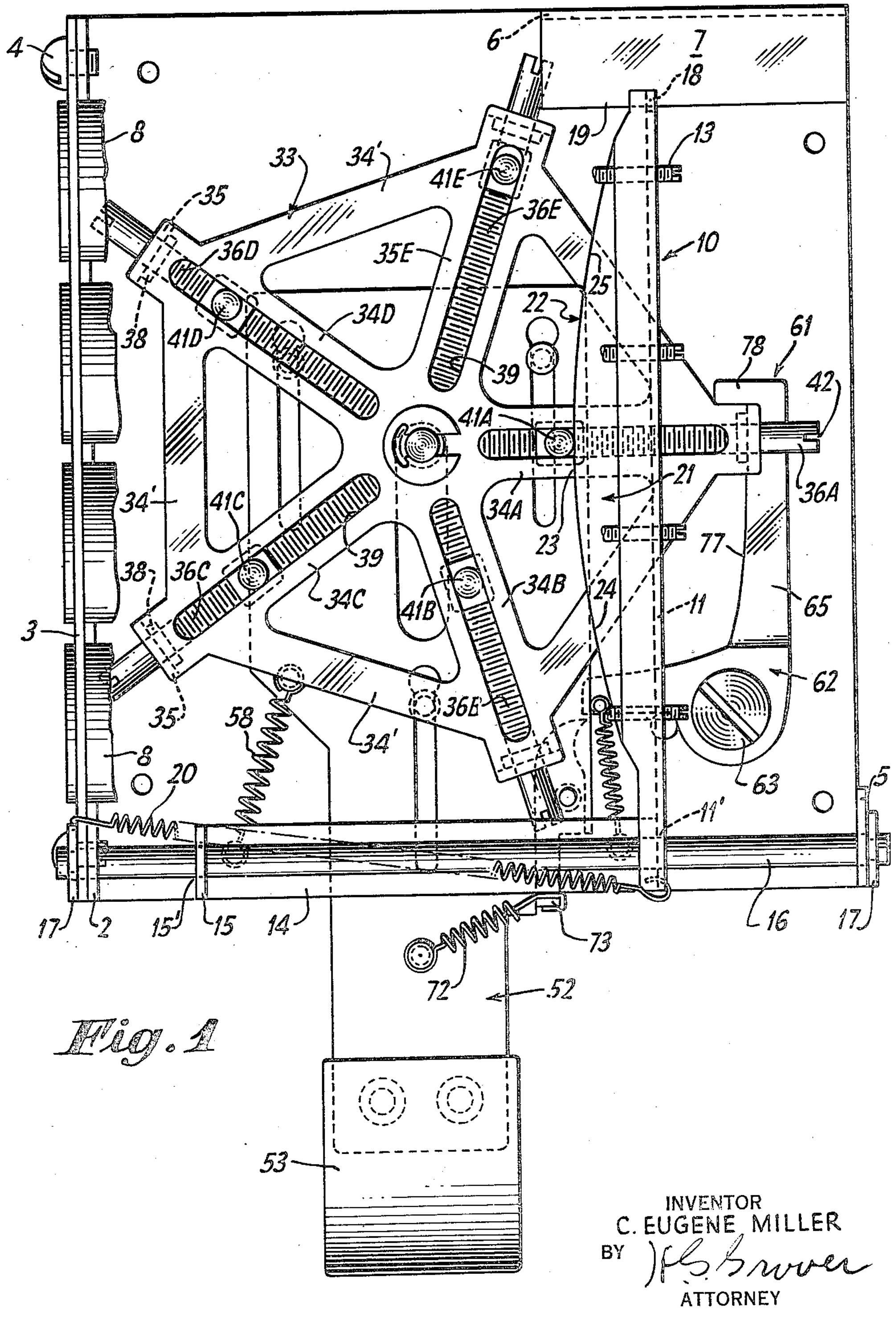
Fig. 1 is a plan view of the tuner according to the invention, on an enlarged scale and with certain parts broken away.

Briefly, the tuning mechanism of the invention consists of a linearly-movable carrier to which the tuning element (or elements) of a radio receiver is attached, a cam member movable with the carrier, a multi-position rotatable turret provided with a plurality of radially adjustable stops, one for each turret position, said stops being movable in the plane of the cam member, and a manually-slidable member adapted to cause rotation of the turret step-by-step to successive positions, so that as the turret is rotated the stop next to be effective is caused to coact with and actuate the cam member to position the carrier and tuning element to a pre-set position as determined by the radial stop adjustment.

Although any desired number of pre-set adjustments for the tuning element may be provided, according to the herein disclosed embodiment the turret is capable of angular adjustment to only five positions which are believed sufficient for the purpose of automatically tuning the receiver to those stations which are most frequently heard.

For a detailed description of the tuning mechanism and its manner of operation reference will now be made to the several figures of the drawings collectively. Shown at 1 is a base plate or frame member which is adapted to be supported on the chassis or other fixed part of the receiver by suitable means (not shown). The base plate at the left has a turned-up edge 2 to which a side plate 3 is fastened, as for example by means of screws 4. At the right the base plate is provided with an upstanding bracket 5 which may form an integral part of the base plate and bent at right angles thereto, or else it may be a separate part attached thereto by spot-welding, for example. At the rear of the base plate there is provided a second bracket having an upstanding part 6 which extends at right angles to the base plate and a part 7 which is bent at right angles to part 6, so that bracket part 7 is disposed in spaced parallel relation with the base plate. Like the bracket 5, bracket 6—7 may form an integral part of the base plate or else comprise a separate part suitably attached to the base plate, as by spot-welding.

The side plate 3 is adapted to support the tuning element or elements of the radio receiver which is here shown as of the permeability type, the same comprising a plurality of tuning coils (not shown), each housed in a shield can 8, and a plurality of ferro-magnetic cores 9, each linearly movable within its respective coil, the axial adjustment of the cores with respect to their coils determining the tuning adjustment of the receiver.

In order to effect axial adjustment of the cores with respect to their coils there is provided a core-carrier or carriage, shown generally at 10, which is provided with a vertically-extending part 11 to which the magnetic tuning cores 9 are attached through the medium of connecting wires 12 and adjusting screws 13. The core-carrier is provided at its forward end with a laterally extending bracket 14 (Fig. 1) which terminates in an ear 15 bent upwardly at right angles thereto and disposed in spaced parallel relation with the carrier part 11. The part 11 and ear 15 are provided with aligned holes 11′ and 15′, respectively, through which there extends a shaft 16, which is journalled at its ends in the side plate 3 at the left and in the bracket 5 at the right, the shaft being retained in position at each end by a C washer 17. The core-carrier is provided at the rear with a slot 18 (Fig. 1) which is adapted to engage the edge 19 of the bracket part 7, said edge 19 at the rear and the shaft 16 at the front serving as a pair of rails on which the core-carrier is adapted to be moved back and forth in a lateral direction. A tension spring 20 having one end attached to side plate 3 and the other end to the carrier serves to urge the carrier latrally to the left, as viewed in Figs. 1 and 2.

Figures 2, 4, 5A, 5B, 5C:
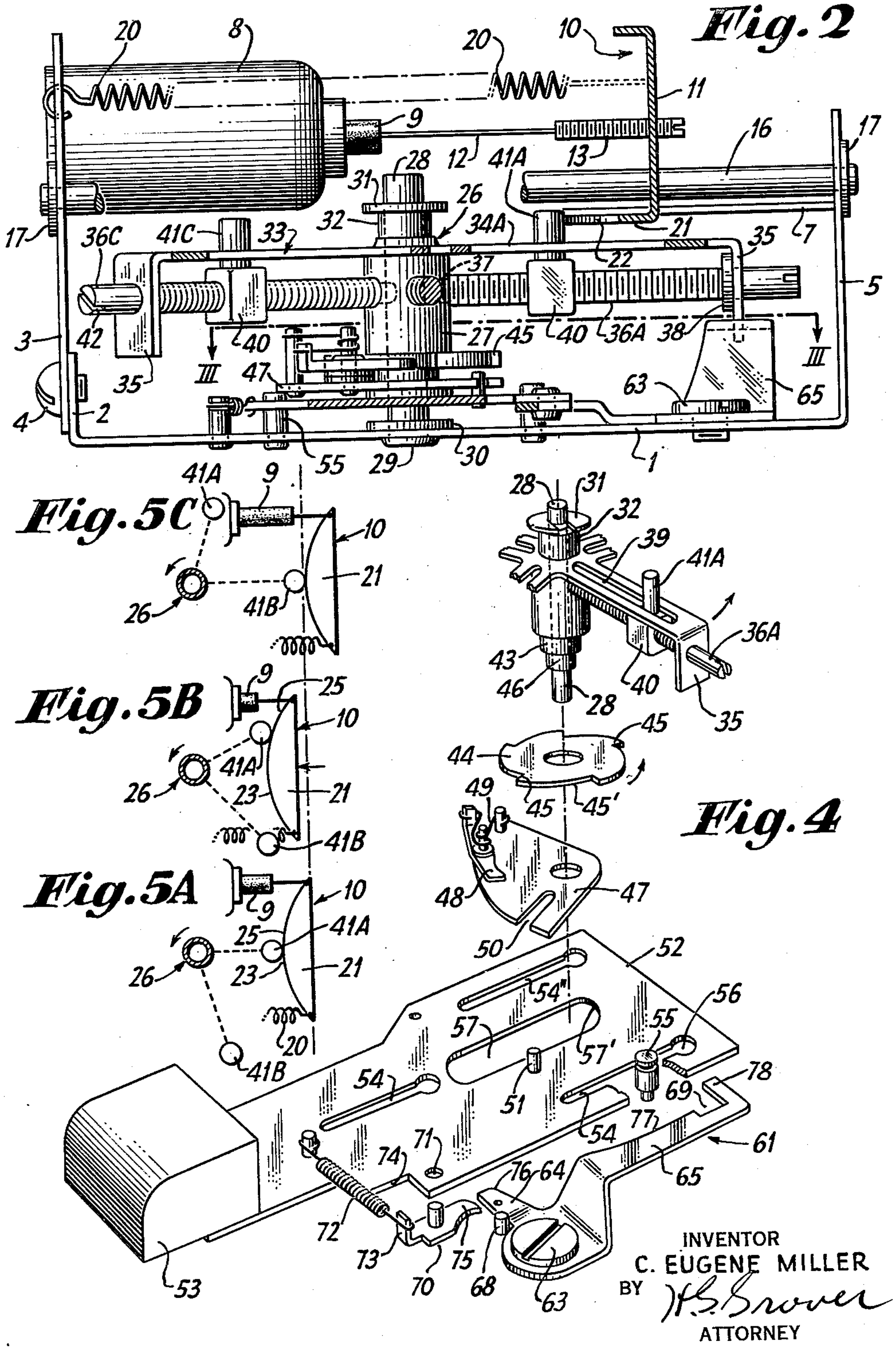
Fig. 2 is a view, in front elevation and partly in section, of the tuner shown in Fig. 1.
Fig. 4 is an exploded view, in perspective, of the turret assembly and related parts.
Figs. 5A to 5C are views showing in diagrammatic fashion two successive positions and an intermediate position of the turret and related parts for explaining the operation of the tuner according to the invention.

The core-carrier is further provided with a cam plate 21 formed integrally with the vertical part 11 and bent at right angles thereto so that the plate is disposed in a horizontal plane (Fig. 2). The cam plate at the left is provided with an arculately-shaped edge 22, as shown in Fig. 1, which is adapted to coact with and be moved by a selected one of a plurality of actuating stops of a rotatable turret, later to be described. The cam plate is provided at its center with a high part 23 and with parts 24 and 25 which slope gradually to the front and rear, respectively.

In order that the assembly of the slidable carrier and tuning cores may be actuated automatically and to predetermined positions of adjustment, there is provided the previously mentioned turret, shown generally at 26, which is arranged to rotate in a horizontal plane. The turret is provided at its center with a hub 27 revolvable on a vertical stud shaft or spindle 28, the lower end of which is riveted to or otherwise affixed to the base plate 1 at 29. The hub at its lower edge bears on a washer 30 which is brazed to the base plate and by means of a C washer 31 retained in a circular groove at the upper end of the shaft and bearing against the upper edge of the hub, the turret is held in position and restrained to move in a horizontal plane.

The hub 27 is formed with a reduced portion 32 at its upper end on which there is fixedly mounted by means of a forced fit or otherwise a web-shaped member 33 which has five equi-angularly spaced arms 34A to 34E radiating outwardly from the hub. For rigidity the arms are interconnected by cross-members 34′. Each arm is provided at its outer end with a downwardly extending ear 35 which is apertured to receive the outer, unthreaded end of a lead-screw. For convenience, the several lead-screws are designated 36A to 36E to correspond with their respective arms 34A to 34E. The inner end of each lead-screw is adapted to be journalled in a suitable bearing 37 formed in the hub 27, and by means of a C washer 38 fitted in a circular groove at the outer end of each lead-screw and bearing against the depending ear, the lead-screws are retained in position.

Corresponding arms and lead-screws are disposed in spaced parallel relation, with the lead-screw aligned or centered with respect to an elongated slot 39 formed in the respective arms. Carried on each of the lead-screws is a core-carrier actuator consisting of a threaded base portion 40 and an upstanding stud or stop pin which is adapted to extend through the slot 39 of its associated arm. For convenience, the several stop pins are designated 41A to 41E to correspond with their respective associated arms and lead-screws. The outer ends of the several lead-screws are provided each with a slot 42 for receiving a suitable tool, such as a screw-driver, whereby the lead-screws may be rotated to effect individual radial adjustments of their respective stops. These screw-driver adjustments are performed when the tuning mechanism is set-up initially to select certain predetermined stations, or when at any time it is desired to make a change in one or more previously selected stations.

As heretofore mentioned, the turret is adapted to be rotated or stepped to successive operative positions, and the means for effecting this stepping action will now be described. On a reduced portion 43 of the hub (Fig. 4) at its lower end there is fixedly mounted a ratchet-wheel 44 by means of a forced fit or otherwise, the wheel being provided with as many teeth 45 as there are arms or turret positions. In assembling the mechanism, the ratchet-wheel and turret-web are so phased that with each turret arm there is vertically aligned a ratchet-wheel tooth. Journalled on a still further reduced portion 46 of the hub, underneath the ratchet wheel, is an oscillatory member 47 which carries at its outer end a pivoted pawl 48 which, by means of a suitably anchored spring 49, is urged to contacting relation with the peripheral edge 45′ of the ratchet-wheel. The oscillatory member is also provided with a slot 50 which is adapted to receive an actuating pin 51 carried by a manually-slidable plate member 52 now to be described.

The slide plate 52 is disposed between the oscillatory member 47 and the base plate 1 and is provided at its forward end with a finger piece 53 which serves as the operating member for the tuning mechanism. In order to restrain movement of the slide plate in the rearward and forward directions, the plate is provided with three longitudinal slots 54, 54′ and 54″ which are adapted each to receive a shouldered pin 55 having a circular groove for that purpose. At their lower ends the guide pins 55 are riveted to the base plate. To simplify the mounting of the slide plate on the base, each of the three slots is provided at the rear with an enlarged portion 56 which permits passage of the pin head preparatory to engagement of the pin groove with the edges of the slot. Also provided in the slide plate is a fourth, centrally located, longitudinal groove 57 through which there is adapted to extend the lowermost reduced portion 46 of the hub. A coil spring 58 (Figs. 1 and 3), attached at one end to the slide plate at 59 and at the other end to the base plate at 60, serves to urge the slide plate to its forward or inoperative position. The movement of the slide plate in the rearward direction, to thereby operate the turret, is limited by the respective forward ends 55' of the three guide slots coacting with their respective guide pins 55, whereas the return movement of the slide plate in the forward direction, under the action of spring 58, is limited by the rear end 57' of slot 57 coacting with the reduced portion 46 of the hub as shown in Fig. 3.

Figure 3:
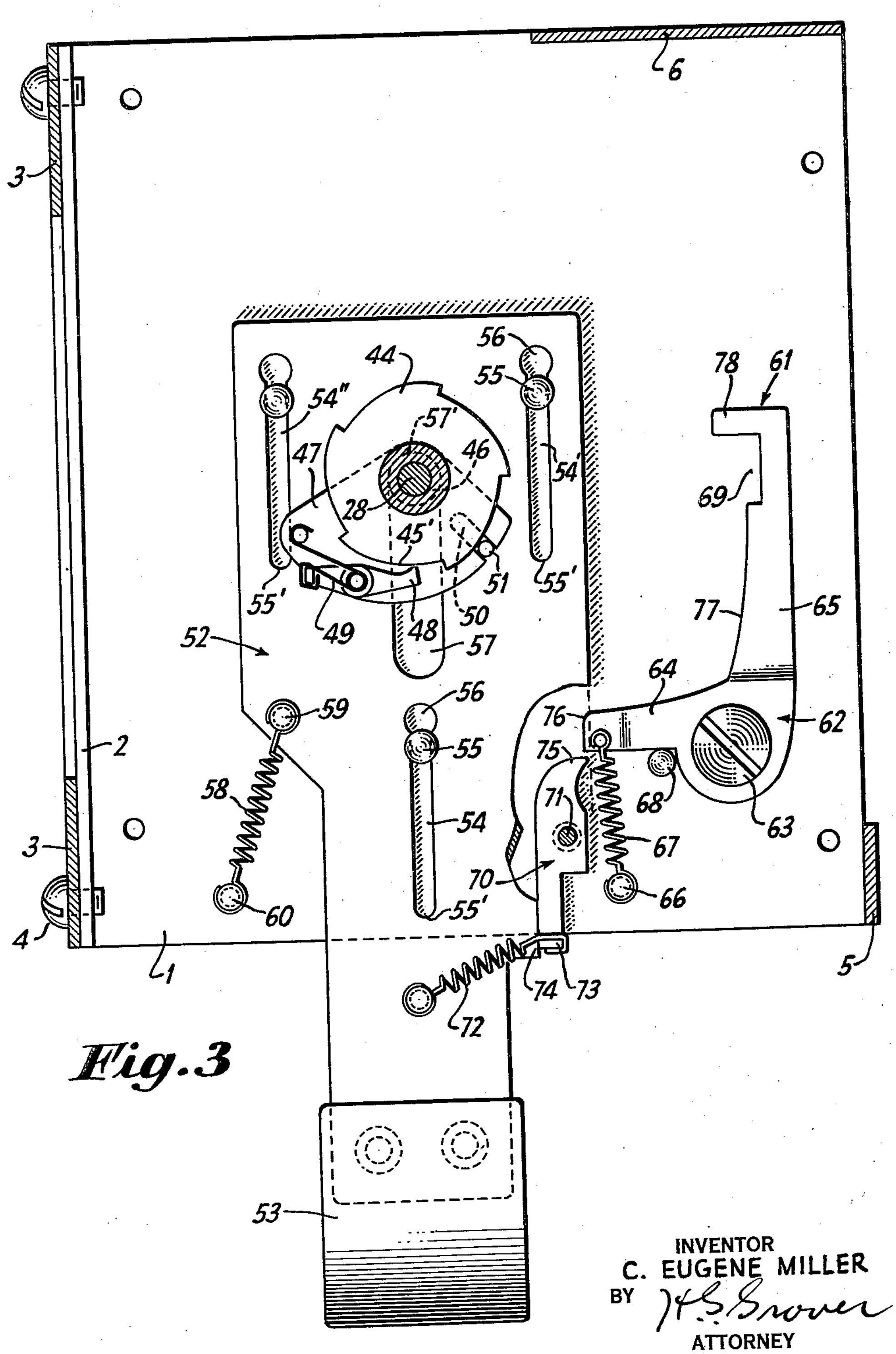
Fig. 3 is a cross-sectional view taken on the line III—III in Fig. 2.

Fig. 3 shows the forward or inoperative position of the slide plate. In this position pawl 48 rests on the ratchet wheel edge 45' slightly in advance of a tooth 45, and the actuating pin 51 is positioned within slot 50 at its outer end. Upon application of a force to the finger piece 53 to move the slide plate rearwardly, oscillatory member 47 is caused to swing in a counterclockwise direction carrying with it pawl 48. Until the pawl reaches and coacts with the tooth 45 in its path, the turret remains stationary. Upon engagement between pawl and tooth, counterclockwise movement of the oscillatory member is transmitted through the ratchet wheel to the turret which, at the conclusion of the rearward travel of the actuated slide plate, is caused to rotate through 72°, the angular separation between the five radially extending turret arms.

In order that, with each actuation of the manually-operable slide member, the turret may be stepped or rotated to successive precise positions which determine the respective tuning-core adjustments, an indexing device, indicated generally at 61, is adapted to cooperate with each of the turret arms in succession. The indexing device is in the form of a bell-crank 62 pivoted at 63 and provided with arms 64 and 65. Attached to arm 64 and to the base plate at 66 is a spring 67 which tends to swing the bell-crank in a counter-clockwise direction against a stop pin 68. The other arm 65 is provided at its outer end with a recess 69 within which the depending ear 35 of a turret arm is adapted to fit snugly.

As shown in Fig. 1, the turret is accurately indexed and locked in position for the angular setting of the turret whereat its arm 34A is held in locked engagement with bell-crank arm 65 and the core-carrier is at a position of adjustment determined by the radially-adjusted actuator pin 41A in contact with the high side 23 of the carrier cam 21. In order to unlock or release the indexing device, to thereby permit rotation of the turret to its next successive setting, that is, whereat turret arm 34B is in locked engagement with arm 65, there is provided a dog 70 pivoted underneath the slide member at 71. The dog is spring-pressed by a spring 72 to force an upstanding lug 73 at the tail end of the dog against the side edge 74 of the slide member and to force its nose 75 into the path of terminal portion 76 of bell-crank arm 64. During the initial movement of the slide member in the rearward direction, and just prior to engagement between pawl 48 and a ratchet-wheel tooth 45, the dog nose 75 coacts with the arm 64 at its terminal portion 76 to actuate and rock the bell-crank in a clockwise direction away from the depending ear of the turret arm. With continued movement of the slide member, the turret begins to rotate in the counter-clockwise direction, and simultaneously with commencement of turret rotation the bell-crank is caused to return to its spring-pressed position shown in Fig. 1, the dog having travelled beyond end 76 of arm 64. The recess 69 of bell-crank arm 65 is now prepared to receive the ear of the next turret arm 34B when brought into position at the end of the rearward stroke of the slide member.

During the course of rotation of the turret, in the case assumed above, to bring arm 34B into position, the ear 35 of said arm traveling in the arc of a circle coacts with the edge 77 of arm 65 (which it will be remembered is in its spring-pressed position shown in Figs. 1 and 3) to cam arm 65 in a clockwise direction in opposition to action of spring 67. When the manual slide member reaches the end of its travel, further rotation of the turret is prevented by the ear of arm 34B striking an extension 78 at the outer end of arm 65, and simultaneously spring 67 causes arm 65 to return forcibly to its locking position whereat the ear of arm 34B is retained within recess 69. The turret will now be accurately indexed at its new angular setting.

In Figs. 5A to 5C there are shown in diagrammatic fashion the successive positions of the tuning element and core-carrier during a cycle of operation which results in the actuation of the turret from one angular setting to the next. In Fig. 5A the turret is shown at the same angular setting as disclosed in Figs. 1 and 2, with the core-carrier 10 and tuning core 9 actuated, in opposition to spring 20, to their respective positions as determined by the radial distance of stop pin 41A from the turret axis. In the intermediate position of Fig. 5B, with the turret partially rotated, the pin 41A has dropped off the high side 23 of the cam, and due to the action of spring 20, said pin is caused to ride on the rear edge 25 of the cam and will continue to do so until the next pin 41B comes into engagement with the front edge 24 of the cam. When this occurs, continued rotation of the turret will cause pin 41B to take over and actuate the core-carrier toward the right, in opposition to spring 20, until the pin reaches the high side of the cam as shown in Fig. 5C. When this occurs, the turret will have been rotated to its next angular setting, the tuning element will have been adjusted to a pre-set position as determined by the lateral displacement of the core-carrier, and the manual slide member will have reached its limit of travel.

Having thus completed the automatic adjustment of the tuner, the manual slide member is released and its return to the forward inoperative position is brought about by the spring 58. The return movement of the slide member will not disturb the locked position of the indexing device 61 since the nose 75 of dog 70, on reaching the terminal part 76 of bell-crank arm 64, will be cammed out of the way by the latter to permit unimpeded return travel of the slide member.

It will be clear from the above detailed description of the tuning mechanism and its manner of operation that I have provided a simple, compact automatic tuner, one which has a high degree of repeat accuracy to pre-set tuning adjustments, and one which may be manufactured at very low cost.

While I have shown and described a preferred embodiment of my invention, it will be understood that various modifications and changes will occur to those skilled in the art without departing from the spirit and scope of this invention. I therefore contemplate by the appended claims to cover any such modifications as fall within the true spirit and scope of my invention.

What I claim is:

1. The combination, in radio apparatus, of an adjustable tuning element, a movable carrier for said tuning element, a cam member movable with the carrier having a cam edge, a rotatable turret provided with a plurality of equi-angularly spaced stops, said stops being individually adjustable in a radial direction each to a position which determines the particular setting to which the tuning element is actuable, and means including a reciprocable member operable upon actuation to rotate the turret step-by-step to successive positions, rotation of the turret to a new position causing the corresponding stop to slidably coact with the cam edge to apply a force to the carrier in the direction of its movement to thereby actuate the tuning element to the setting corresponding to said stop.

2. The combination, in radio apparatus, of an adjustable tuning element, a linearly movable carrier for said tuning element, a member carried by the carrier having a cam edge which extends in a direction transverse to the direction of movement of the carrier, a rotatable multi-position turret provided with a plurality of equi-angularly spaced stops, one for each turret position, said stops being individually adjustable in radial directions each to a position which determines the particular setting to which the tuning element is actuable, spring means effective at each turret position to bias the cam edge of the carrier member against the stop then effective, and means including a manually reciprocable member operable upon actuation to rotate the turret to a next successive position, the stop corresponding to said next position acting, during the rotation of the turret, as a cam follower and carrier-actuator whereby the carrier and tuning element are urged against the action of the spring means to a position determined by the radial adjustment of said stop.

3. The combination, in radio apparatus, of an adjustable tuning element, a linearly movable carrier for said tuning element, a member carried by the carrier having a cam edge which extends in a direction transverse to the direction of movement of the carrier, a rotatable turret having a plurality of pre-set positions provided with a plurality of equi-angularly spaced stops, one for each turret position, said stops being individually adjustable in radial directions each to a position which determines the particular setting to which the tuning element is actuable, spring means for biasing the cam edge of the carrier member toward the turret, and means operable upon each actuation thereof to rotate the turret one step at a time to successive positions, the stop effective at each pre-set position of the turret acting, prior to the rotation of the turret to a pre-set position, to cam the tuning-element carrier against the action of the spring means to a position determined by the radial adjustment of the stop then effective.

4. The combination defined in claim 3, wherein the turret rotating means comprises a ratchet-wheel movable with the turret and a pawl cooperatively related with the ratchet-wheel carried on a slide member which is adapted to be actuated manually.

5. The combination defined in claim 3, wherein the turret is provided with a hub rotatable on a shaft, a ratchet-wheel affixed to the turret-hub having as many teeth as there are turret positions, an oscillatory member journalled on the shaft, a pawl pivotally mounted on said member and spring-pressed against the ratchet-wheel, and a manually-operable slide member having a push-button at one end and an actuating pin at the opposite end which cooperates with a slot in the oscillatory member, the arrangement being such that upon the manual slide member being pushed in, the pin and slot connection acts successively to move the pawl into engagement with a ratchet-wheel tooth and then to rotate the turret to its next pre-set position.

6. The combination defined in claim 3, wherein the turret is provided with a hub rotatable on a shaft, a ratchet-wheel affixed to the turret-hub having as many teeth as there are turret positions, an oscillatory member journalled on the shaft, a pawl pivotally mounted on said member and spring-pressed against the ratchet-wheel, a manually-operable slide member having a finger piece at one end and an actuating pin at the opposite end which cooperates with a slot in the oscillatory member, the arrangement being such that upon the manual slide member being pushed in, the pin and slot connection acts successively to move the pawl into engagement with a ratchet-wheel tooth and then to rotate the turret to its next pre-set position, latch means for locking the turret in each of its pre-set positions, and means operable during the initial movement of the manual slide member to disengage the latch means to permit, during further movement of the slide member, rotation of the turret to its next successive position.

7. The combination defined in claim 3, wherein the turret is provided with a plurality of radial arms each of which is slotted along its length, a plurality of lead-screws disposed each in parallel spaced relation with the slot of each arm, each stop having a base portion which is threaded on its respective lead-screw and another portion which extends through the slot, and means at the outer end of each lead-screw whereby the latter may be rotated to bring about a desired radial adjustment of each of the respective stops.

8. The combination defined in claim 3, wherein the turret is provided with a plurality of radial arms each of which is slotted along its length, a plurality of lead-screws disposed each in parallel spaced relation with the slot of each arm, each stop having a base portion which is threaded on its respective lead-screw and another portion which extends through the slot into the path of the cam edge of the carrier member, the cam edge being of such configuration that as the turret is stepped from one position to the next, the stop corresponding to said first position is permitted to ride on one portion of the cam edge until the stop corresponding to said next position is brought into engagement with another portion of the cam edge, the latter stop being effective, prior to rotation of the turret to said next position, to cam the tuning-element carrier to a position determined by the radial adjustment of said latter stop and effective, at said next turret position, to hold the carrier at its newly adjusted position.

9. The combination defined in claim 3, wherein the turret is provided with a hub rotatable on a vertical shaft and with a plurality of radial arms each of which is slotted along its length, a plurality of lead-screws disposed each in parallel spaced relation with the slot of each arm, each stop having a base portion which is threaded on the lead-screw and another portion which extends through the slot into the path of the cam edge of the carrier member, a ratchet-wheel affixed to the turret-hub having as many teeth as there are turret positions, an oscillatory member journalled on the shaft, a pawl pivotally mounted on said member disposed in the plane of the ratchet-wheel and spring-pressed against the ratchet-wheel, a manually-operable slide member restrained to move in a plane at right angles to the turret shaft having a finger-piece at one end and an actuating pin at the opposite end which cooperates with a slot in the oscillatory member, spring means for urging the slide member to a forward inoperative position, the arrangement being such that upon the manual slide member being pushed in rearwardly against the action of said spring means to an operating position, the pin and slot connection acts successively to move the pawl into engagement with a ratchet-wheel tooth and then to rotate the turret to its next pre-set position, latch means for locking the turret in each of its pre-set positions, means operable during the initial movement of the manual slide member to disengage the latch means to permit, during further movement of the slide member, rotation of the turret to its next successive position, the cam edge of the carrier member being of such configuration that as the turret is stepped from one position to the next, the stop corresponding to said first position is permitted to ride on one portion of the cam edge until the stop corresponding to said next position is brought into engagement with another portion of the cam edge, the latter stop being effective, prior to rotation of the turret to said next position, to cam the tuning-element carrier to a position determined by the radial adjustment of said latter stop and effective, at said next turret position, to hold the carrier at its newly adjusted position, and means at the outer end of each lead-screw whereby the latter may be rotated to bring about a desired radial adjustment of the respective stops.

10. A sequential tuning mechanism including a slidable tuning carriage having means connected thereto adapted to be acted on for sliding it and carrying tuning parts, a rotatable turret located directly below said carriage with means for rotating the turret, a plurality of adjustable devices angularly positioned but radially adjustable on the turret for acting on said means on the carriage to slide it directly to its tuning position, means for holding the carriage in tuning position, means for locking the turret directly after the carriage has been moved by it to tuning position, means including part of the locking means for unlocking the turret, said carriage holding means also serving to urge the carriage in a direction opposite to the tuning direction set up by said turret device.

11. A sequential tuning mechanism for a radio receiving set including a framework, a turret rotatably supported in the framework, ratchet means associated with the turret to aid in turning it, operating structure movably mounted for actuation of said turret, co-acting means positioned between the ratchet means and the operating structure to interlink them after a predetermined movement of the operating structure, a carriage slidably mounted on said framework and having means for co-acting with a device capable of sliding it, tuning means supported by the framework and having movable parts fastened to adjustable means on said carriage, adjustable devices carried by the turret for acting on said carriage co-acting means as the turret is turned to move the carriage to a tuning position, means for locking and unlocking the turret in and from its tuning position and means acting on the carriage to urge it in a direction opposite to the tuning direction set up by said turret device.

12. A sequential tuning mechanism as set forth in claim 11, further characterized in that the turret has equally spaced sections each of which carries a screw with a threaded block thereon adapted to travel longitudinally of the screw as the same is turned, the block having an extension which will engage a cam member on the carriage to move it to a tuning position as defined by the location of said block on its screw.

13. A sequential tuning mechanism as set forth in claim 11, further characterized in that the turret has equally spaced slotted arms with downwardly extending flanges at the periphery of the turret in alignment with the arms, a screw for each arm having its head end located in its flange and its inner end received in a cooperative socket in a part of said turret, each screw having a threaded block thereon with an extension projecting through the slot in its arm, said extension acting when the turret is turned on a member of the tuning carriage to move it to a tuning position, dependent on the location of the block on its screw.

14. A sequential tuning mechanism as set forth in claim 11, further characterized in that the turret has equally spaced slotted arms with downwardly extending flanges at the periphery of the turret in alignment with the arms, a screw for each arm having its head positioned outside its associated flange, the screw having an annular recess between its head and thread with a thrust member between the inner wall of the recess and the inner surface of the flange, the inner end of the screw being socketed in a part of the turret, each screw having a threaded block thereon with an extension projecting through the slot in its arm, said extension acting when the turret is turned on a member of the tuning carriage to move it to a tuning position, dependent on the location of the block on its screw.

15. A sequential tuning mechanism as set forth in claim 11 further characterized in that said co-acting means positioned between the turret ratchet means and the operating structure includes a release cam and a latch lever having an arm for engaging angularly spaced parts of the turret to hold it in a tuning position, said latch lever being connected for operation by said cam, the cam having a connection with said operating structure whereby it is started in motion when the operating structure starts its movement, an index pawl for engaging the ratchet means and means associated with the cam for moving the index pawl into engagement with the ratchet means after a predetermined time and movement of the cam and means for restoring the latch lever to latching position after a predetermined movement of said cam.

16. A sequential tuning mechanism as set forth in claim 11 further characterized in that the turret has equally spaced sections each of which carries a screw with threaded means thereon adapted to travel longitudinally of the screw as the same is turned, said threaded means having a formation thereon which will engage a cam member on the carriage to move it to a tuning position.

17. A sequential tuning mechanism as set forth in claim 11 further characterized in that said co-acting means positioned between the turret ratchet means and the operating structure includes, a movable member in operative engagement with the operating structure, a pawl pivotally mounted on said member and normally resiliently held against a stop thereon, a latch lever having an arm for engaging parts of said turret after the turret has been moved by the operating structure through one of its cycles, the latch lever having a cam surface engaged by said pawl to control the movement of said lever, said member in its movement actuating said ratchet means after first moving the latch lever and arm to release the turret.

18. A sequential tuning mechanism for a radio receiving set including, a framework, a turret mounted for rotation only in the framework, a tuning carriage slidably mounted on the framework above the turret, stationary circuit tuning parts mounted on the framework, movable circuit tuning parts carried by said carriage for cooperation with said stationary parts, means adjustably mounted on the turret for directly acting on the carriage to move it to a position defined by the turret, means for returning the carriage in a direction opposite to that given it by the turret and means for rotating the turret one step or tuning station at a time.

19. A sequential tuning mechanism for a radio receiving set including, a framework, a turret mounted for rotation only in the framework, a tuning carriage having its main portion slidably mounted on the framework above the turret and having a bar carrying adjusting devices, circuit tuning parts attached to said devices, circuit tuning parts mounted on the framework for cooperation with said first mentioned tuning parts, means mounted in equal angularly spaced relation but radially adjustable on the turret for directly acting on the carriage to move it to a position defined by said turret adjustable means, means for rotating the turret one step at a time and means for moving the carriage in an opposite direction from that given it by the turret.

20. A sequential tuning mechanism having a framework, a carriage slidably mounted thereon and carrying tuning parts, said carriage having means associated therewith adapted to be acted on for sliding the carriage into tuning position, a rotatable turret, a plurality of devices arranged in equal angular spaced relation on the turret and radially adjustable thereon for acting on the means associated with the carriage for sliding the carriage into tuning position, an operating member which has interconnecting operating means with the turret, with a stroke sufficient to move the turret through only one of said angular spaces at a time to move the carriage to a tuning position, means for locking the turret at the end of its tuning movement, means for removing the lock during the early part of a new movement of the operating member and spring means acting on the carriage immediately it is released by the turret device to move it to a position where it will be engaged by another of said turret devices.

21. A tuning mechanism for a radio receiver including a slidable carriage supported and moving simultaneously a plurality of circuit tuning parts, spring means connected to said carriage for moving said carriage in one direction and means associated with the carriage adapted to be acted on to slide the carriage in a direction opposite to the spring, a turret positioned below said slidable carriage and having equal angularly positioned adjustable tuning lugs for engaging said carriage associated means for moving and positioning the carriage, movable operating structure, pawl and ratchet means for connecting said operating structure to said turret and for directly moving the same at one stroke the angular space of one lug and causing said lug to engage said means associated with the carriage for sliding the carriage in a direction opposite to that of said spring.

22. A sequential tuning mechanism including a slidable tuning carriage having means connected thereto adapted to be acted on for sliding it and carrying tuning parts, a rotatable turret located directly below said carriage with means for rotating the turret, a plurality of adjustable devices angularly positioned but radially adjustable on the turret for acting on said means on the carriage to slide it directly to its tuning position, a spring interconnected with the carriage, said spring acting to hold the carriage in tuning position and also serving to urge the carriage in a direction opposite to the tuning direction set up by said turret device, means for locking the turret after the carriage has been moved against the tension of said spring to tuning position and means including part of the locking means for unlocking the turret.

23. In a radio tuning mechanism having a framework, a movable tuning member carried by the framework and being positionable at various positions thereon, a unidirectional spring for moving said member in one direction, a turret having a shaft carried by the framework for intermittent rotation, the turret carrying at equi-angular spacings a number of radial adjustably positioned lugs, means automatically positioned to lock the turret from rotation, an indexing and latch-controlling mechanism for disengaging said means, unlocking said turret and indexing it as required; said mechanism including a ratchet wheel rotatably carried on said shaft but fastened to said turret, a release cam, an index pawl rotatably carried on the shaft and brought into operation with the ratchet wheel by movement of said cam, a latch lever with a spring to hold it in one direction of operation, the lever having a member adapted to engage parts on the turret to act as a positive stop therefor when said lever is moved toward locking position by its holding spring, said lever member also acting when said latch lever is moved in another direction by said cam to unlock the turret; means carried on the movable tuning member adapted to be engaged by said turret lugs for moving the tuning member to tuning position in a direction opposite to the movement caused by said spring, an operating unit for operating said controlling mechanism and resetting means for said unit.

24. In a presettable tuner device for mechanically bringing tuning elements to preselected tuning positions: an elongated carriage for carrying a portion of the tuning elements distributed along its length, said carriage being movably mounted for travel generally transversely of its length to bring said carried portion of the tuning elements into different positions with respect to the remainder of the tuning elements and thereby control the tuning; and a carriage-positioning mechanism including bias structure connected for urging the carriage to move in one transverse direction, and an adjustably presettable positioning stop connected for limiting the biased movement of the carriage in said one transverse direction to a corresponding tuning position, said positioning stop being connected for limiting the carriage position by direct engagement with a portion of the carriage approximately in the center of the carriage length, to accurately and reproducibly fix the tuning position of the carriage.

25. In a presettable sequence tuner device for mechanically bringing tuning elements to a succession of preselected tuning positions in individual steps; an elongated carriage for carrying a portion of the tuning elements distributed along its length, said carriage being movably mounted for travel generally transversely of its length to bring said carried portion of the tuning elements into different positions with respect to the remainder of the tuning elements and thereby control the tuning; and a carriage-positioning mechanism including bias structure connected for urging the carriage to move in one transverse direction, and a turret having a plurality of adjustably presettable positioning stops for limiting the biased movement of the carriage in said one transverse direction to a corresponding tuning position, said mechanism also including a turret pivot rotatably carrying the turret, and turret rotating structure connected for rotating the turret about the pivot in individual steps to separately bring the individual positioning stops into carriage-limiting position at which said stops directly engage a portion of the carriage approximately in the center of the carriage length, and said turret pivot being aligned with the carriage-limiting position of the stops in the direction of carriage travel to accurately and reproducibly fix the tuning position of the carriage.

26. In a presettable sequence tuner device for mechanically bringing tuning elements to a succession of preselected tuning positions, in individual steps; an elongated carriage for carrying a portion of the tuning elements distributed along its length, said carriage being movably mounted for travel generally transversely of its length to bring said carried portion of the tuning elements into different positions with respect to the remainder of the tuning elements and thereby control the tuning; and a carriage-positioning mechanism including bias structure connected for urging the carriage to move in one transverse direction, and a generally flat turret having a plurality of adjustably presettable positioning stops for individually limiting the biased carriage movement in said one transverse direction to a corresponding tuning position, said mechanism also including pivot structure holding the turret in compact superposed relation to the carriage as well as at least some of the tuning elements, for rotation in a plane parallel to that of the carriage movement, and turret rotating elements connected for rotating the turret about the pivot structure in individual steps to separately bring the individual positioning stops into carriage limiting position at which the stops are held in direct engagement with the carriage at approximately the center of the carriage length, to accurately and reproducibly fix the tuning position.

C. EUGENE MILLER.

REFERENCES CITED

The following references are of record in the file of this patent:

UNITED STATES PATENTS

| Number | Name | Date |
|---|---|---|
| 407,163 | Brown | July 16, 1889 |
| 1,684,519 | Scheerbarth | Sept. 18, 1928 |
| 1,810,985 | Reichenbach | June 23, 1931 |
| 2,313,653 | Lyman | Mar. 9, 1943 |
| 2,342,691 | Plensler | Feb. 29, 1944 |
| 2,342,851 | Fichter et al. | Feb. 29, 1944 |
| 2,399,702 | White | May 7, 1946 |